(12) United States Patent
Chen et al.

(10) Patent No.: US 12,022,618 B2
(45) Date of Patent: Jun. 25, 2024

(54) PRINTED CIRCUIT BOARD WITH STACKED PASSIVE COMPONENTS

(71) Applicant: Western Digital Technologies, Inc., San Jose, CA (US)

(72) Inventors: Chien Te Chen, Taichung (TW); Cong Zhang, Shanghai (CN); Yu Ying Tan, Taichung (TW); Hsiao Jung Lin, Taichung (TW); Chieh Kai Yang, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 439 days.

(21) Appl. No.: 17/237,604

(22) Filed: Apr. 22, 2021

(65) Prior Publication Data
US 2022/0346234 A1 Oct. 27, 2022

(51) Int. Cl.
*H05K 1/18* (2006.01)
*H05K 1/11* (2006.01)
(Continued)

(52) U.S. Cl.
CPC ............ *H05K 1/181* (2013.01); *H05K 1/111* (2013.01); *H05K 3/24* (2013.01); *H05K 3/284* (2013.01);
(Continued)

(58) Field of Classification Search
CPC .......... H05K 1/181; H05K 1/111; H05K 3/24; H05K 3/284; H05K 3/3442; H05K 2201/094; H05K 2201/10015; H05K 2201/10022; H05K 2201/1003; H05K 2201/10159; H05K 2201/10515; H05K 2203/1316; H05K 2203/1322; H05K 3/205; H05K 3/4007; H05K 2201/10636; H05K 1/11; H05K 3/303; H05K 3/40; H05K 1/0231; H05K 1/112; H05K 1/141; H05K 1/182; H05K 2201/049; H05K 2201/10651; H05K 2201/10674; H01L 25/0652; H01L 25/18; H01L 2225/0651;
(Continued)

(56) References Cited

U.S. PATENT DOCUMENTS 8,988,857 B2  3/2015  McConnell et al.
9,918,386 B2  3/2018  Frenette et al.
(Continued)

FOREIGN PATENT DOCUMENTS

CN   205231050 U   5/2016
JP   2018113316 A  7/2018

*Primary Examiner* — Steven T Sawyer
(74) *Attorney, Agent, or Firm* — Michael Best & Friedrich LLP

(57) ABSTRACT

A substrate of an electronic device includes a first set of contact pads and a first set of contact pillars having a height greater than the first set of contact pads. Components are coupled to the first set of contact pads and the first set of contact pillars in traversing directions. The components coupled to the contact pillars are positioned above the components coupled to the first set of contact pads such that at least a first portion of a first side of the component coupled to the contact traces faces a first side of the components coupled to the contact pillars. Stacking passive components in this manner can allow for increased component density without increasing package size.

16 Claims, 8 Drawing Sheets

(51) Int. Cl.
  *H05K 3/24*   (2006.01)
  *H05K 3/28*   (2006.01)
  *H05K 3/34*   (2006.01)
  *H01L 25/065* (2023.01)
  *H01L 25/18*  (2023.01)

(52) U.S. Cl.
  CPC ........ *H05K 3/3442* (2013.01); *H01L 25/0652* (2013.01); *H01L 25/18* (2013.01); *H05K 2201/094* (2013.01); *H05K 2201/10015* (2013.01); *H05K 2201/10022* (2013.01); *H05K 2201/1003* (2013.01); *H05K 2201/10159* (2013.01); *H05K 2201/10515* (2013.01); *H05K 2203/1316* (2013.01); *H05K 2203/1322* (2013.01)

(58) Field of Classification Search
  CPC ....... H01L 2225/06562; H01L 25/0657; H01L 25/16; Y02P 70/50
  See application file for complete search history.

(56) References Cited

U.S. PATENT DOCUMENTS

| | | | |
|---|---|---|---|
| 2004/0262774 A1* | 12/2004 | Kang | H01L 24/11 |
| | | | 257/E23.021 |
| 2009/0315163 A1 | 12/2009 | Johnson et al. | |
| 2011/0110060 A1* | 5/2011 | Togashi | H05K 1/0231 |
| | | | 361/782 |
| 2011/0216513 A1* | 9/2011 | Lee | H05K 3/465 |
| | | | 361/761 |
| 2015/0091179 A1* | 4/2015 | Shenoy | H10B 12/00 |
| | | | 438/109 |
| 2015/0187745 A1* | 7/2015 | Chiu | H01L 24/97 |
| | | | 257/737 |
| 2016/0113144 A1* | 4/2016 | Ye | H01L 21/4871 |
| | | | 361/709 |
| 2016/0307832 A1* | 10/2016 | Uzoh | H01L 23/36 |
| 2017/0117263 A1* | 4/2017 | Yeh | H01L 25/0657 |
| 2019/0206813 A1 | 7/2019 | Kim et al. | |
| 2020/0105665 A1 | 4/2020 | Jeong | |
| 2020/0128673 A1* | 4/2020 | Cheah | H05K 1/183 |
| 2022/0052021 A1* | 2/2022 | Fay | H01L 24/45 |

* cited by examiner

PRINTED CIRCUIT BOARD WITH STACKED PASSIVE COMPONENTS

BACKGROUND

This application relates generally to printed circuit boards, and more particularly, to a configuration of traces and connections within a printed circuit board that are configured to increase component density without expanding packaging size.

The current trend in packaged integrated circuits ("IC"), such as memory devices (for example, SD cards, micro SD cards, USB cards, and the like) is to increase component density while also maintaining or reducing packaging size. Passive components, such as resistors, capacitors, and inductors, require substantial space within a packaged IC. Specifically, packaging of passive components require additional space and require special treatment of traces (e.g., tin finishing), for use within modern packaged ICs, such as flip chip packaged ICs. In some instances, embedded passive substrates are used to incorporate passive components within an IC package. While the use of embedded passive substrates allows for smaller packaging, the increase in component density for newer devices, along with the desire for smaller packaging reduces the effect of standard embedded passive substrate devices. For example, embedding passive components within a substrate often increases the required thickness of the substrate, and therefore the device. In some instances, passives may be placed underneath integrated circuit devices, such as those with ball grid arrays, where no connections are present on the integrated device. However, this requires complicated design considerations, and the ball grid arrays must be accurately mapped and understood. Further, package height limits may further come into play when embedding passives underneath integrated devices. Thus, a solution for increasing passive component density without increasing package sizing of an integrated circuit device is needed.

SUMMARY

Increases in component density within data storage devices may require an increase in packaging sizes. By stacking passive components, the component density can be increased without a corresponding increase in packaging sizes.

One embodiment of the present disclosure includes a printed circuit board, which includes a substrate comprising a first set of contact pads and a first set of contact pillars. The first set of contact pillars have a height greater than the first set of contact pads. The printed circuit board includes a first component coupled to the first set of contact pads along a first direction, the first component having a first side facing the first set of contact pads, and a second side opposite the first side, and a second component coupled to the first set of contact pillars along a second direction wherein the second direction traverses the first direction. The second component includes a first side facing the first set of contact pads and a second side opposite the first side. The second component is positioned above the first component such that at least a first portion of the second side of the first component faces the first side of the second component.

In another embodiment of the present disclosure, a method for manufacturing a stacked component electronic device is described. The method includes forming a first set of contact pads and a second set of contact pads on a carrier, and forming a first set of conductive pillars on the second set of contact pads, wherein the first set of conductive pillars have a height at least five times greater than a height of the first set of contact pads. The method also includes attaching a first component to the first set of contact pads, the first component having a first side facing the first set of contact pads and a second side opposite the first side. The method further includes attaching a second component to the first set of conductive pillars, the second component having a first side facing the first set of contact pads, and a second side opposite the first side. The method includes encapsulating the first and second components with a mold material, wherein the molding material encapsulates the first set of contact pads, the second set of contact pads, the first set of conductive pillars, the first component and the second component.

In another embodiment of the of the present disclosure, a data storage device is provided, including a substrate having a first set of contact pads and a first set of contact pillars, wherein the first set of contact pillars have a height greater than the first set of contact pads. The data storage device includes a memory controller and one or more NAND die stacks coupled to the substrate, wherein the one or more NAND die stacks are in electrical communication with the memory controller. The data storage device includes a first component coupled to the first set of contact pads along a first direction and having a first side facing the first set of contact pads, and a second side opposite the first side, and a second component coupled to the first set of contact pillars along a second direction traversing the first direction. The second component has a first side facing the first set of contact pads, and a second side opposite the first side. The second component is positioned above the first component such that at least a first portion of the second side of the first component faces the first side of the second component. The substrate, the first component, and the second component are encapsulated in a molded material.

Various aspects of the present disclosure provide for improvements in memory devices. For example, increasing component density while maintaining or reducing current packaging dimensions allows for greater performance in smaller packages. The present disclosure can be embodied in various forms. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc. Those of skill in the art also will realize that although the disclosure refers to a substrate used in a data storage device, the disclosure may apply to substrates used in other types of electronic devices. The disclosure applies to both substrates and printed circuit boards used in electronic devices. Further, although specific examples disclose memory devices, it will be understood by those of skill in the art that the inventive concepts disclosed herein may be applied to other types of electronic devices that are assembled using a printed circuit board.

Figure 1:
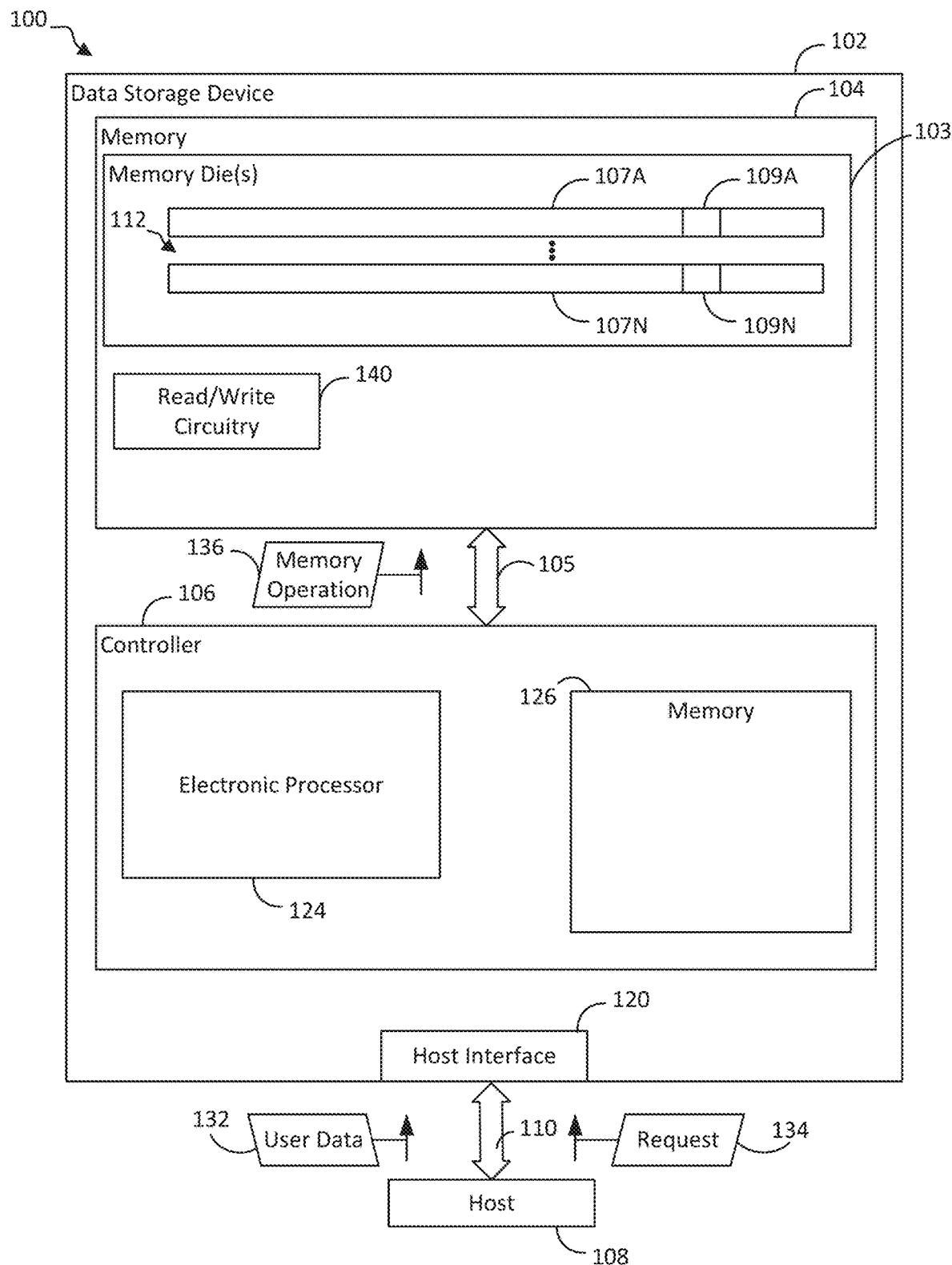
FIG. 1 is block diagram of one example of a system including a data storage device, according to some embodiments.

FIG. 1 is a block diagram of one example of a system 100 that includes a data storage device 102 in communication with a host device 108. The data storage device 102 includes a memory device 104 (e.g., nonvolatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication with the communication path 110 between the data storage device 102 and the host device 108, such as when the interface 120 is communicatively coupled to the host device 108. In some embodiments, the communication path 110 may include one or more electrical signal contact pads or fingers that provide electrical communication between the data storage device 102 and the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data 134 to be read from the memory device 104, The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory device 104 and writing to the memory device 104. In some examples, the host device 108 may operate m compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements(e.g., memory cells that are referred to herein as a "string"), such as a representative storage elements 109A and 109N, respectively.

The memory device 104 may include support circuitry, such as read/write circuitry 140 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies may include corresponding read/write circuitry that is operable to read from and/or write to storage elements within the individual memory die independent of any other read and/or write operations at any of the other memory dies.

The controller 106 is coupled to the memory device 104 (e.g., the one or more memory dies 103) with a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 with the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124.

The controller 106 may send the memory operation 136 (e.g., a read command) to the memory device 104 to cause the read/write circuitry 140 to sense data stored in a storage element. For example, the controller 106 may send the read command to the memory device 104 in response to receiving a request for read access from the host device 108. In response to receiving the read command, the memory device 104 may sense the storage element 107A (e.g., using the read/write circuitry 140) to generate one or more sets of bits representing the stored data.

Figures 2A, 2B:
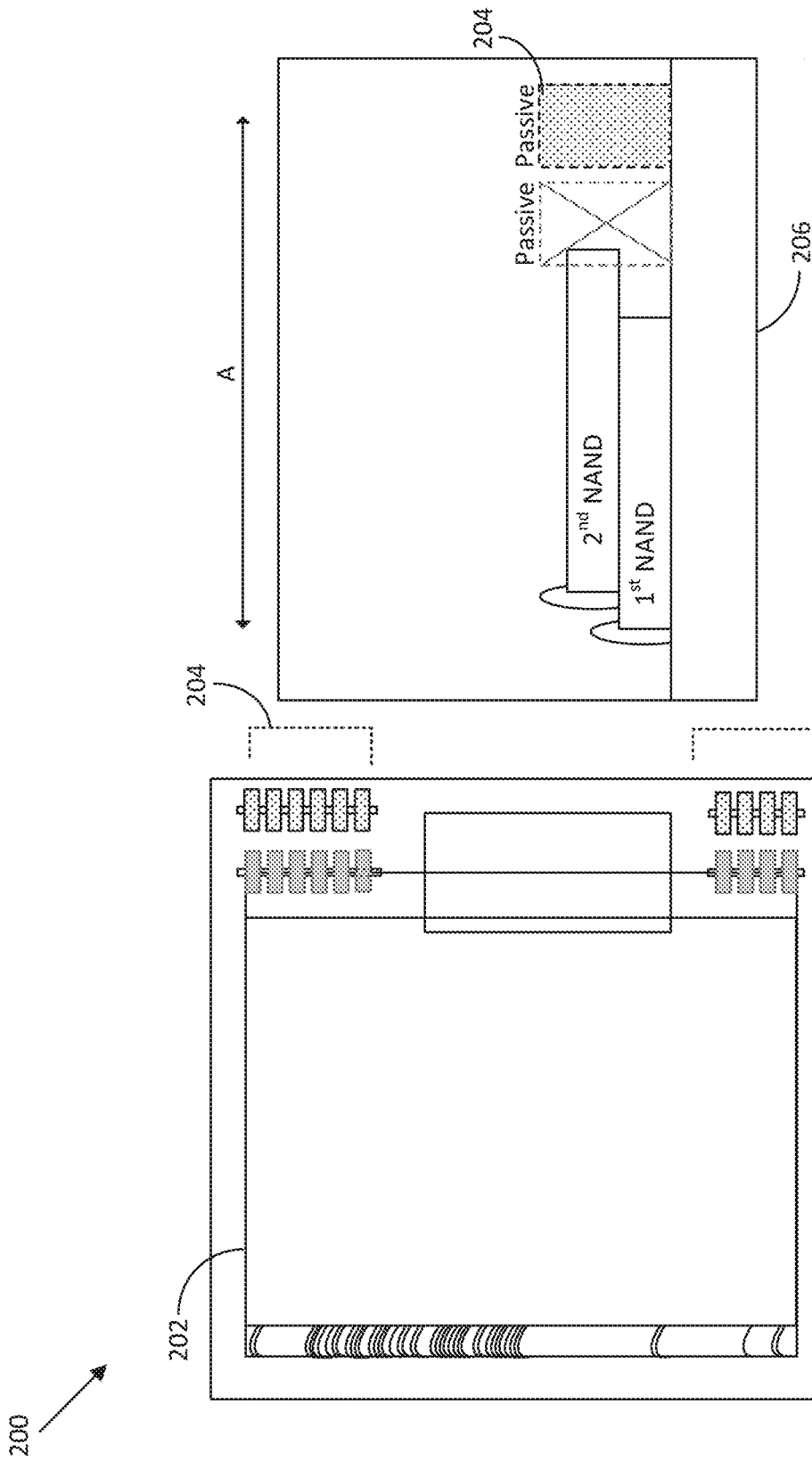
FIGS. 2a-2b are cross-sectional views of a data storage device.

Turning now to FIG. 2a, a top down view of an example of a packaged data storage device 200, such as data storage device 102, is shown, according to some embodiments. The packaged data storage device 200 includes a number of memory dies 202, such as memory dies 103, and a number of passive components 204 coupled to a substrate 206. The passive components 204 may be one or more of resistors, capacitors, inductors, or other passive components, as applicable. FIG. 2b is a side cross-sectional view of the packaged data storage device 200 and shows the memory dies 202 are stacked in a staggered vertical orientation. Due to this staggered orientation, the amount of vertical space on the substrate 206 along axis "A" is reduced. Further, the height of the passive components 204 prevent them from being positioned under the staggered memory dies 202, thereby limiting the space available for the passive components 204 in the packaged data storage device 200.

Figure 3:
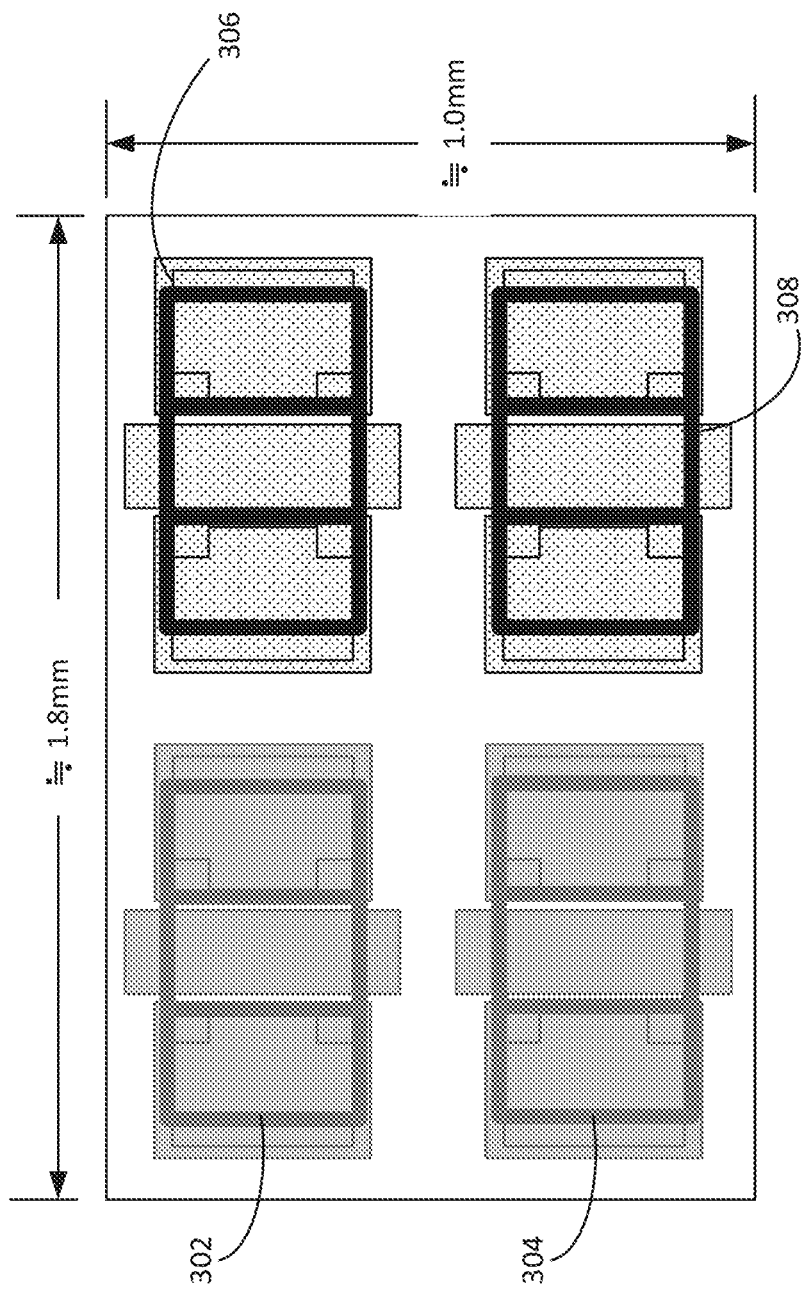
FIG. 3 is a top view of a passive component layout in the data storage device of FIGS. 2a-2b.

Turning now to FIG. 3, a magnified view of a portion of the passive components 204 is shown. As shown in FIG. 3, four passive components 302, 304, 306, and 308 are shown arranged in a single layer, in a two by two arrangement. Component spacing requirements for a given application dictate the allowable distance between the passive components 302, 304, 306, 308. Due to the arrangement shown in FIG. 3, as the number of passive components increases, so does the required footprint in one or more of a vertical direction or a horizontal direction.

Figure 4:
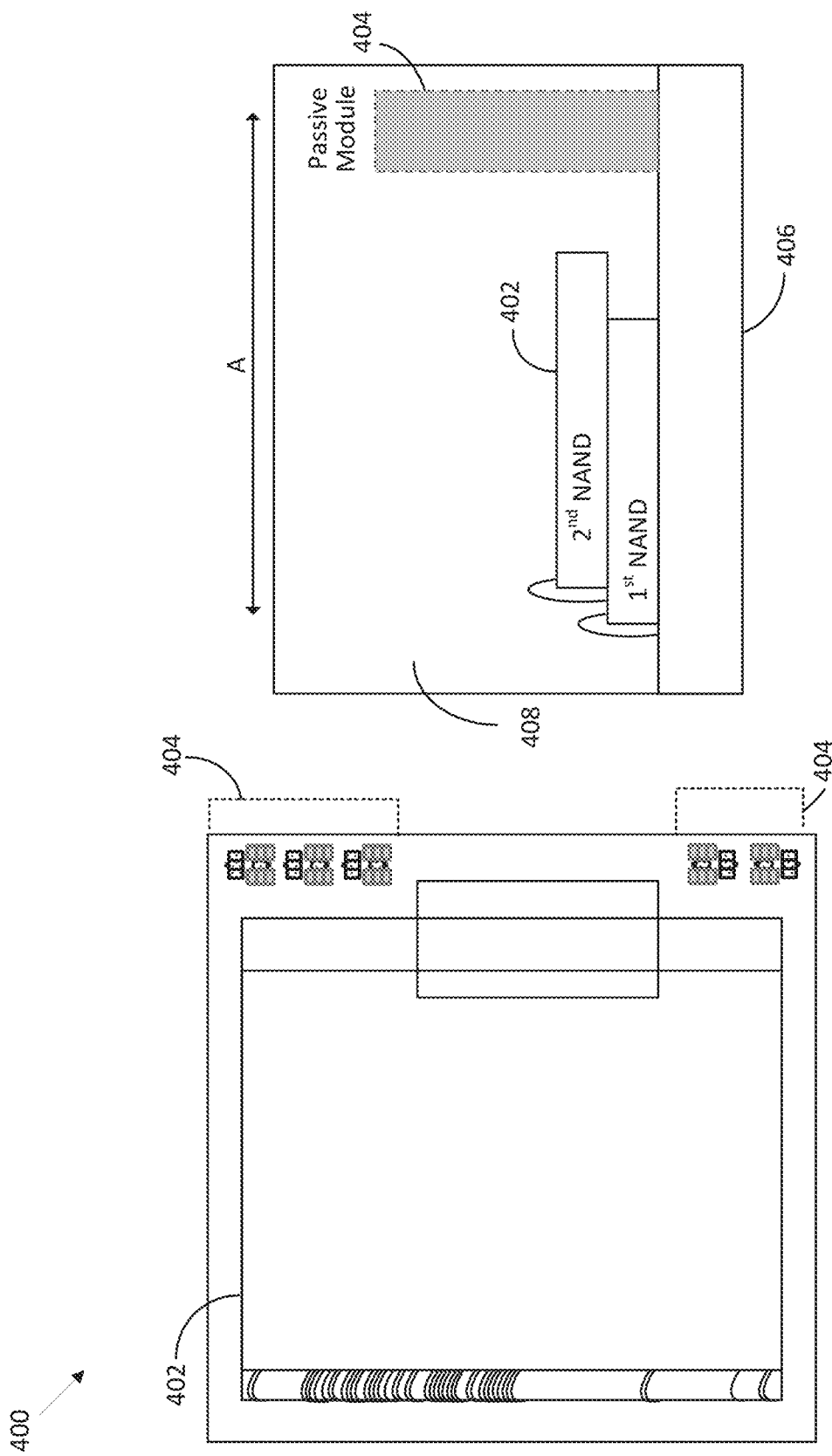
FIGS. 4a-4b are a cross-sectional views of a data storage device with stacked passive devices, according to some embodiments.

Turning now to FIG. 4a, a top down view of an example packaged data storage device 400 incorporating stacked passive devices is shown, according to some embodiments. In one embodiment, the packaged data storage device 400 may be an SD card, a micro SD card, a USB card, or other similar packaged data storage device. Similar to the packaged data storage device 200 described above, the packaged data storage device 400 includes a number of memory dies 402 arranged in a staggered vertical orientation, as shown in FIG. 4b. While only two memory dies 402 are shown in FIGS. 4a-4b, it is contemplated that the packaged data storage device 400 may include more than two memory dies 402 or less than two memory dies 402. The packaged data storage device 400 includes a number of passive components 404. In the packaged data storage device 400, the passive components 404 are arranged in a stacked orientation on a substrate 406 as will be described in more detail below. By stacking the passive components 404, the passive components 404 may be more densely packaged within the packaged data storage device 400 without requiring additional space in either a vertical or horizontal direction along a surface of the substrate 406. For example, stacking the passive components 404 allows for the unused vertical space within a mold 408 of the packaged data storage device 400 to be utilized more efficiently.

Figure 5:
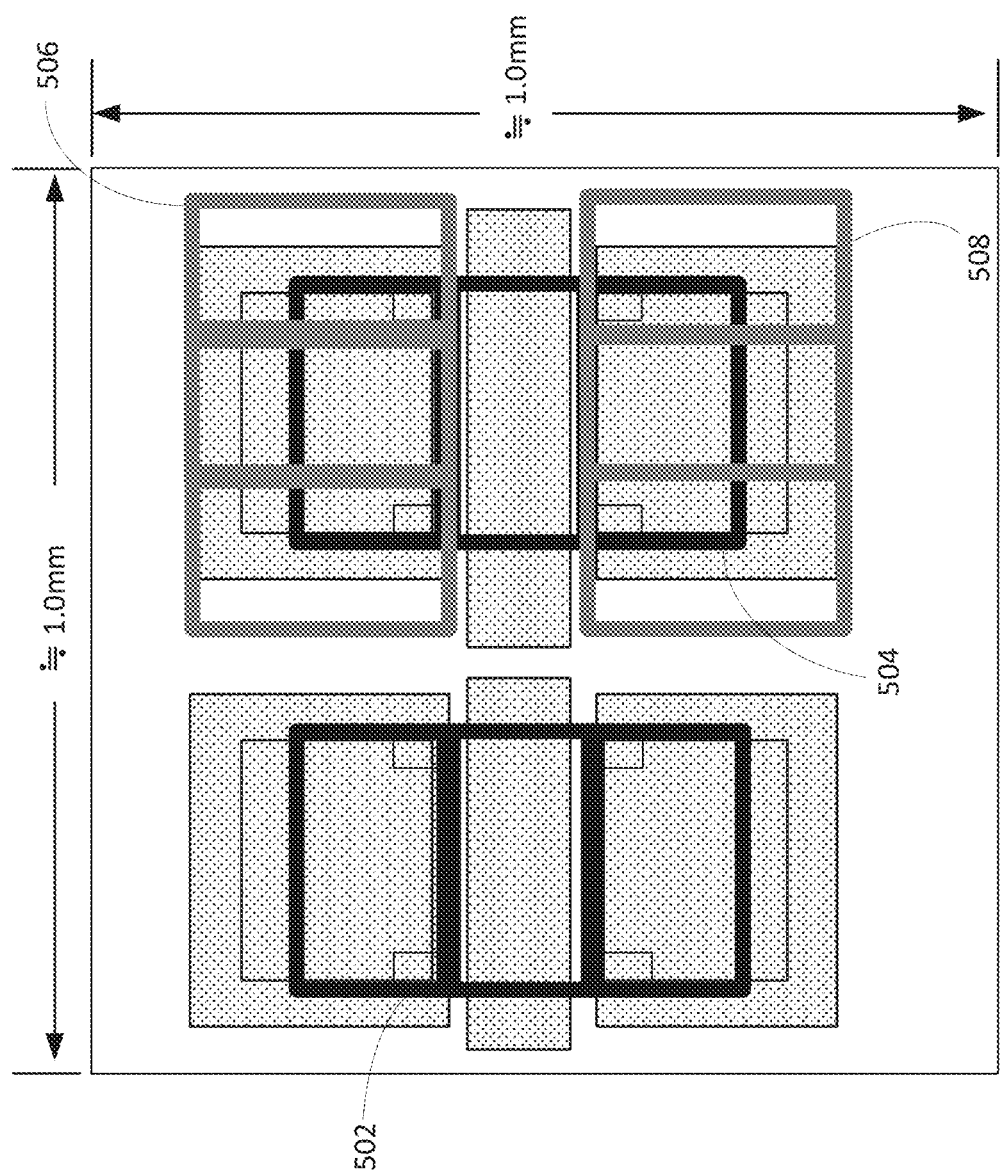
FIG. 5 is a top view of a passive component layout in the data storage device of FIGS. 4a-4b, according to some embodiments.

Turning now to FIG. 5, a magnified view of a portion of the passive components 404 arranged within the packaged data storage device 400 is shown, according to some embodiments. As shown in FIG. 5 there are two vertically arranged passive components 502, 504, and two horizontally arranged passive components 506, 508. While the orientation of the passive components 502, 504, 506, 508 are described as horizontal or vertical, it is understood that the orientations may be varied for a given application, and that the passive components 502, 504, may be generally arranged orthogonally to the passive components 506, 508. As shown in FIG. 5, the horizontally oriented passive components 506, 508 are arranged atop the vertically arranged passive components 502, 504. Thus, for similar component packages to those shown in FIG. 3, the passive components 502, 504, 506, 508 may be contained within a smaller footprint than the same passive components 302, 304, 306, 308 shown in FIG. 3. Thus, by stacking the passive components 502, 504, 506, 508, the passive components may be interspersed between each other thereby allowing for an increase in component density over the design shown in FIGS. 2a-2b.

Further, by stacking passive components, the effect of the staggered memory dies 402 within the packaged data storage device 400 is mitigated without sacrificing overall packaging sizes. Also, while the above passive components 502, 504, 506, 508 are described with regards to package size, it is contemplated that the passive components 502, 504, 506, 508 are embedded passive devices formed directly into a substrate, such as substrate 406. In other examples, the passive components 502, 504, 506, 508 are integrated passive devices, such as thick and/or thin film integrated passive devices. In still further examples, the passive components 502, 504, 506, 508 are packaged such as standard in line packaged ("SIL") or other appliable packages. In other examples, the passive components 502, 504, 506, 508 are bare dies/chips.

Figure 6A:
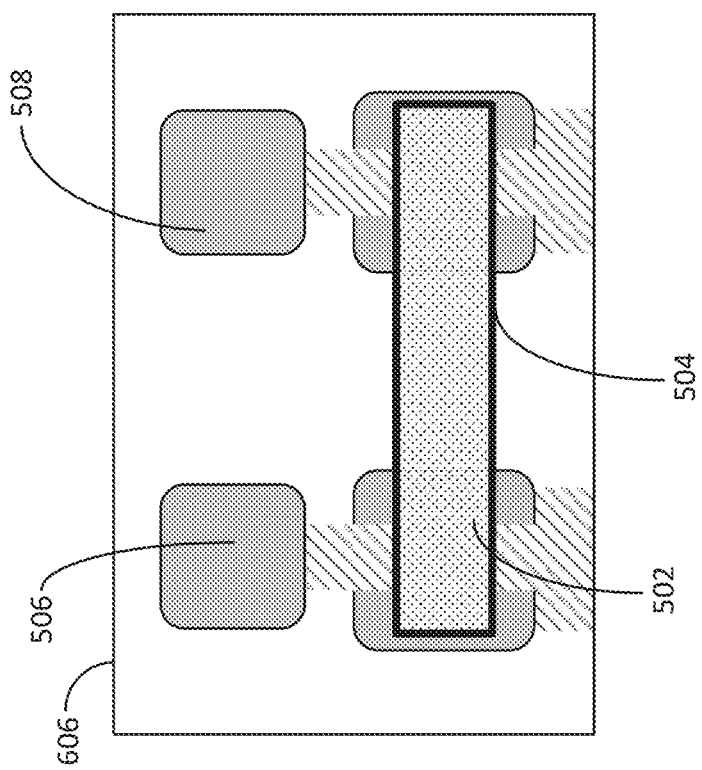
FIGS. 6a-6b are cross-sectional views of a portion of the data storage device of FIGS. 4a-4b, according to some embodiments.
Figure 6B:
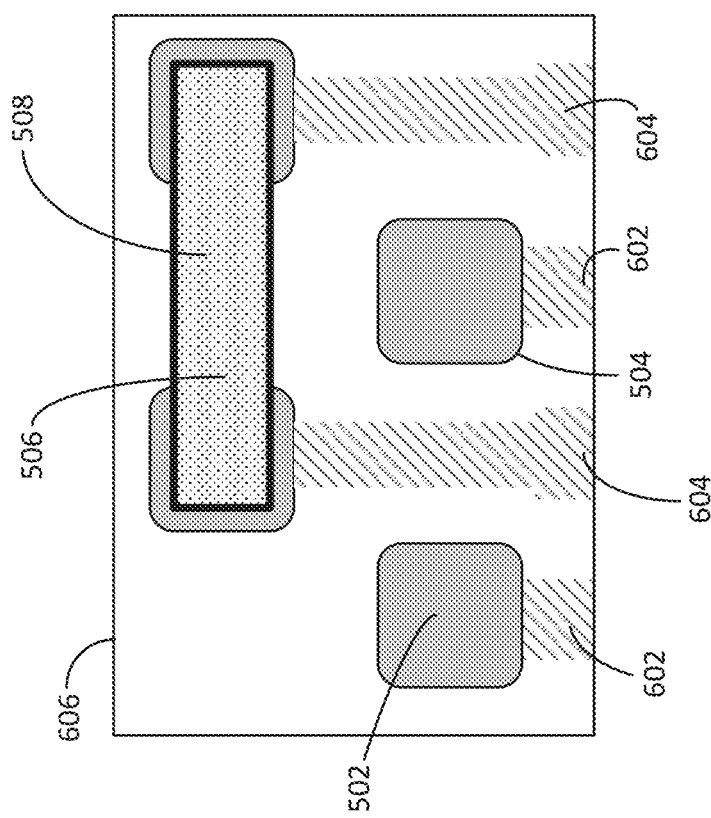

Turning now to FIGS. 6a and 6b, a cross-sectional view of a portion of the packaged data storage device 400 is shown, according to some embodiments. As shown in FIGS. 6a and 6b, the passive components 502, 504 are arranged on contact pads 602, and the passive components 506, 508 are arranged on elongated pads 604. In one embodiment, the elongated pads 604 are copper pillars; however, other conductive materials may be used, such as gold, tinned copper, etc. The passive components 502, 504, 506, 508 are surrounded by a molding material 606. The molding material 606 may be a thermoset plastic, epoxy resin (e.g., cresol novolac or biphenyl), silica filters, or other molding materials or compounds as appropriate for an application. Further, as shown in FIGS. 6a-6b, the elongated pads are shown to be interspersed between the contact pads 602. By placing the passive components 506, 508 on the interspersed elongated pads, the passive components 506, 508 may be placed above the passive components 502, 504 that are placed on the elongated pads 604. This stacked configuration allows for an increase in component density without requiring additional packaging space along a length or width of the packaged data storage device.

Figure 7:
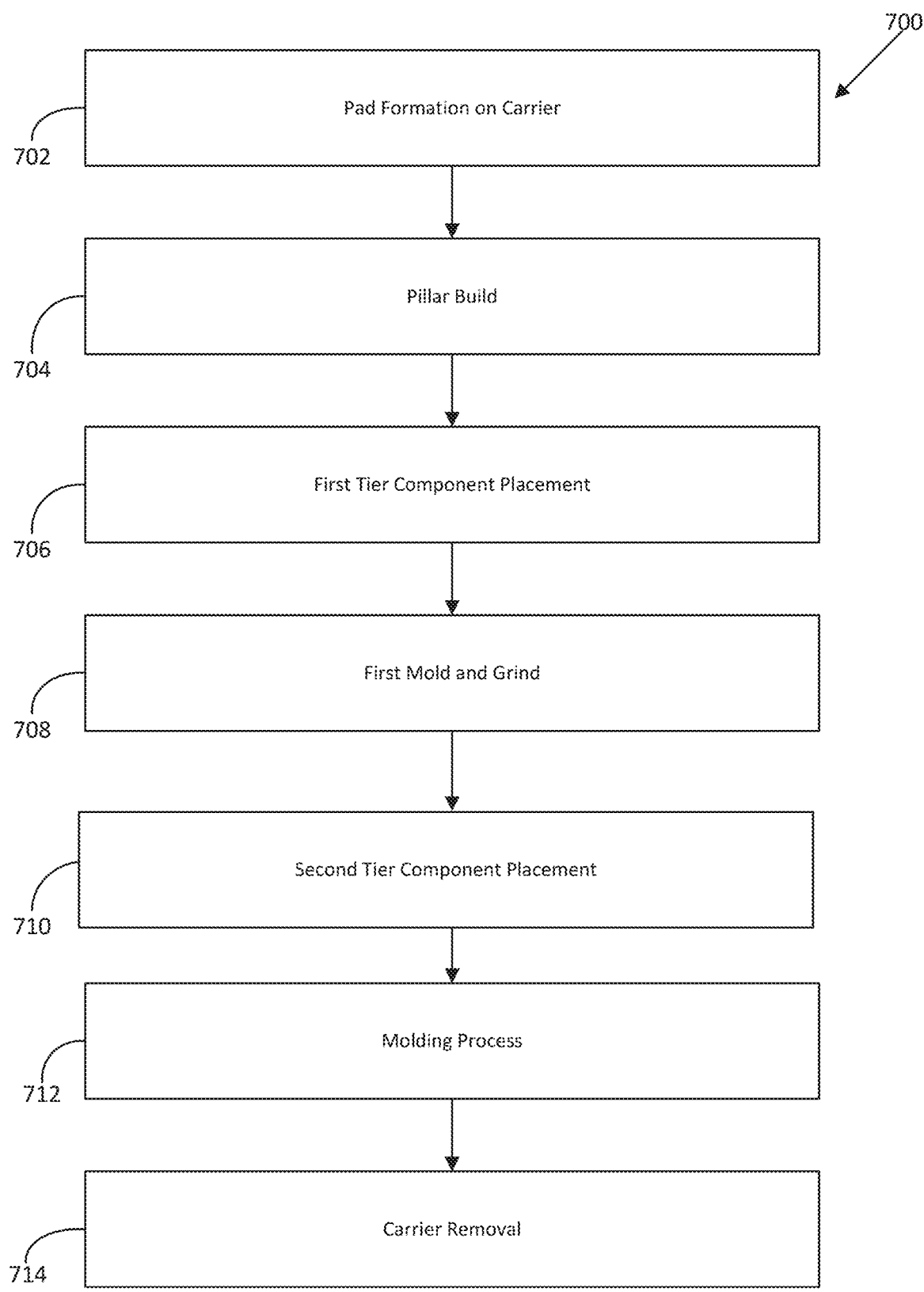
FIG. 7 is a flowchart illustrating a process for constructing a stacked passive module, according to some embodiments.

Turning now to FIG. 7, a process 700 for creating a stacked passive component module is shown, according to some embodiments. In one embodiment, the stacked passive component module may include one or more passive components and be a standalone module, which may be incorporated into a larger system, such as a data storage device (e.g., data storage device 102). In other embodiments, the stacked passive component module shown below may be part of a larger packaged device, such as data storage device 102 or packaged data storage device 400. In some examples, the stacked passive component modules described herein are constructed using molded or embedded trace substrate technology. Accordingly, a stacked passive component module is understood to be one or more passive components within a molded package.

Figure 8:
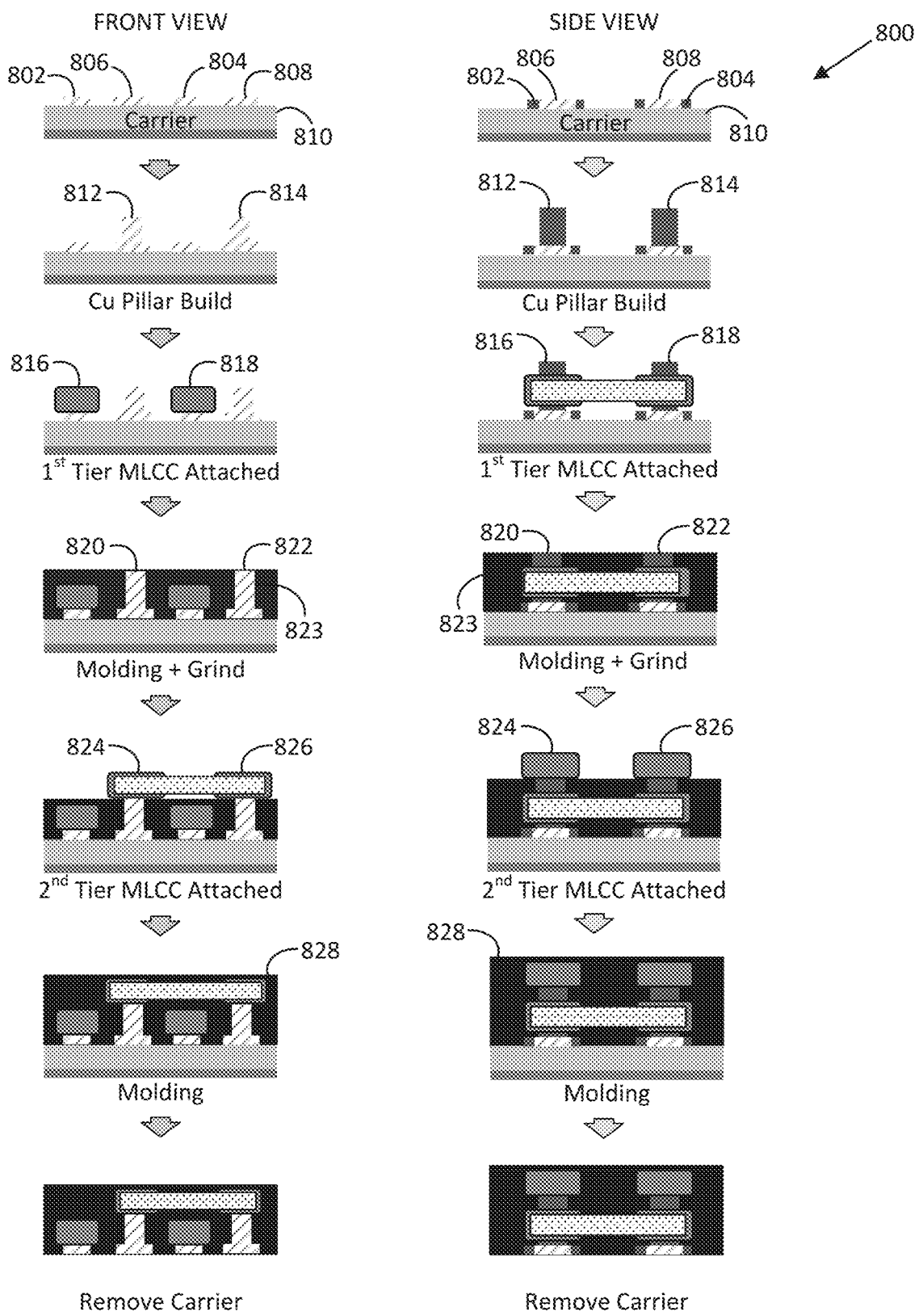
FIG. 8 is a fabrication process for a stacked passive module, according to some embodiments.

The process 700 is described in conjunction with the construction steps shown in FIG. 8. However, the construction steps shown in FIG. 8 are for illustrative purposes only, and it is understood that the process 700 described below is applicable to various passive component module designs with various types and configurations of components, and are not limited to the construction shown in FIG. 8. FIG. 8 shows the construction of a passive component module 800 from both a front view and a side view, wherein the side view is an orthogonal view to the front view.

At block 702, one or more contact pads 802, 804, 806, 808 are formed on a carrier 810. The contact pads 802, 804, 806, 808 may be formed of conductive materials such as copper. However, other conductive materials such as gold, silver, nickel-gold, and the like may also be used for a given application. In one embodiment, the contact pads 802, 804, 806, 808 are formed using a semi-additive process. However, other processes may be used for a given application. In one embodiment, the contact pads 802, 804, 806, 808 are formed using a deposition process, such as a metallic deposition process. In other embodiments, the contact pads 802, 804, 806, 808 may be formed using an etching process (e.g. removing excess metal to form the contact pads 802, 804, 806, 808). In one example, the contact pads 802, 804, 806, 808 have a height of approximately 10 microns. However, heights of more than 10 microns or less than 10 microns are also contemplated.

At block 704, pillars 812, 814 are formed atop traces 806, 808. In one embodiment, the pillars 812, 814 are constructed of copper. However, other materials are contemplated for various applications. In one embodiment, the pillars 812, 814 are formed using a copper (or other metallic) deposition process. For example, the pillars 812, 814 may be formed using a similar deposition process by which the contact pads 802, 804, 806, 808 are formed. To form the pillars, the deposition process may be applied longer to an area associated with the pillars 812, 814. For example, a coating may be applied to the contact pads 802, 804 and to portions of contact pads 806, 808 after formation, which prevents additional metal from being deposited during a deposition process. In one embodiment, the pillars 812, 814 may be approximately 150 microns in height. In other embodiments, the pillars 812, 814 may be approximately 200 microns in height. However, in other embodiments, the pillars 812, 814 are greater than 200 microns in height, or less than 200 microns in height. In some examples, the pillars 812, 814 have a height at least ten times greater than the contact pads 802, 804. However, heights greater than ten times or less than ten times the contact pads 802, 804 are also contemplated.

At block 706, first tier components are placed, such as components 816, 818 are placed onto the contact pads 802, 804. First tier components are those components that are coupled directly to contact pads, such as contact pads 802, 804. The first-tier components may be one or more types of passive components such as resistors, capacitors, inductors, and/or other passive component types. In some examples, the passive components may be multi-layered ceramic capacitors. In one embodiment, a solder is used to couple the first-tier components 816, 818 to the contact pads 802, 804. For example, a silver solder may be used. In other examples, a silver-tin solder may be used. However, other solder material may be used as appropriate for a given application.

At block 708, a molding and grinding process is performed on the passive component module, such as passive component module 800, The molding process encapsulates the first-tier components 816, 818, the pillars 812, 814, and the contact pads 802, 804, 806, 808 as well as the spaces in-between with a molding material 823. The molding material 823 may be a thermoset plastic, epoxy resin (e.g., cresol novolac or biphenyl), silica filters, or other mold compounds as appropriate for an application. The grinding process (such as a general mold grinding process) is then applied to remove the molding material 823 from a top of the passive component module to expose a top portion 820, 822 of the pillars 812, 814.

At block 710, second tier components are placed, such as components 824, 826 are placed onto the exposed top portions 820, 822 of the pillars 812, 814. Second tier components are those components that are coupled directly to pillars, such as pillars 812, 814. The second-tier components may be one or more types of passive components such as resistors, capacitors, inductors, and/or other passive component types. In some examples, the passive components may be multi-layered ceramic capacitors. Generally, to increase component density, the second-tier components are oriented at a ninety-degree angle to the first-tier components, as shown in at least FIG. 8. However, other orientations and configurations of the first-tier components and the second-tier components are contemplated. In one embodiment, a solder is used to couple the second-tier components 824, 826 to the pillars 812, 814. For example, a silver-tin solder may be used; however, other solder material may be used as appropriate for a given application.

At block 712, a second molding process is performed, similar to the molding process described at block 708. The second molding process encapsulates the exposed portion of the pillars 812, 814 and the second-tier components 824, 826 in a molding material 828. The molding material 828 may be a thermoset plastic, epoxy resin (e.g., cresol novolac or biphenyl), silica filters, or other mold compounds as appropriate for an application. In one embodiment, the molding material 828 is the same as the molding material 823. At process block 714, the carrier 810 is removed. For example, an etching process may be used to remove the carrier 810.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A printed circuit board comprising:
   a substrate comprising a first set of contact pads and a first set of contact pillars integrally formed of the same material thereon on a second set of contact pads, wherein the first set of contact pillars have a height greater than the first set of contact pads and wherein a width of the first set of contact pillars is narrower than a width of the second set of contact pads such that the first set of contact pillars are positioned at a midpoint of the width of the second set of contact pads;
   a first component coupled to the first set of contact pads along a first direction, the first component having a first side facing the first set of contact pads, and a second side opposite the first side; and
   a second component coupled to the first set of contact pillars along a second direction, wherein the second direction traverses the first direction, the second component having a first side facing the first set of contact pads, and a second side opposite the first side;
   wherein the second component is positioned above the first component such that at least a first portion of the second side of the first component faces the first side of the second component.

2. The printed circuit board of claim 1, wherein the first component comprises one or more of a resistor, a capacitor, and an inductor, and the second component comprises one or more of a resistor, a capacitor, and an inductor.

3. The printed circuit board of claim 1, wherein the height of the first set of contact pillars is at least five times greater than the height of the first set of contact pads.

4. The printed circuit board of claim 1, wherein the height of the first set of contact pillars is 200 microns.

5. The printed circuit board of claim 1, wherein the substrate, the first component, and the second component are encapsulated in a mold material.

6. The printed circuit board of claim 1, wherein the first set of contact pillars are copper contact pillars.

7. The printed circuit board of claim 1, further comprising:
   a third set of contact pads and a second set of contact pillars, wherein the second set of contact pillars have a height greater than the third set of contact pads;
   a third component coupled to the third set of contact pads along the first direction, wherein the third component has a first side facing the first set of contact pads, and a second side opposite the first side; and
   a fourth component coupled to the second set of contact pillars along the second direction, the fourth component having a first side facing the first set of contact pads, and a second side opposite the first side;
   wherein the fourth component is positioned above the first component and the third component such that at least a first portion of the second side of the first component and a first portion of the second side of the third component faces the first side of the fourth component.

8. The printed circuit board of claim 1, wherein the first direction is at a ninety degree angle to the second direction.

9. A data storage device, comprising:
   a substrate comprising a first set of contact pads and a first set of contact pillars integrally formed of the same material thereon on a second set of contact pads, wherein the first set of contact pillars have a height greater than the first set of contact pads and wherein a width of the first set of contact pillars is narrower than a width of the second set of contact pads such that the first set of contact pillars are positioned at a midpoint of the width of the second set of contact pads;
   a memory controller coupled to the substrate;
   one or more NAND die stacks coupled to the substrate and in electrical communication with the memory controller;
   a first component coupled to the first set of contact pads along a first direction, the first component having a first side facing the first set of contact pads, and a second side opposite the first side; and
   a second component coupled to the first set of contact pillars along a second direction, wherein the second direction traverses the first direction, the second component having a first side facing the first set of contact pads, and a second side opposite the first side;

wherein the second component is positioned above the first component such that at least a first portion of the second side of the first component faces the first side of the second component, and wherein the substrate, the first component, and the second component are encapsulated in a mold material.

10. The data storage device of claim 9, wherein the first component comprises one or more of a resistor, a capacitor, and an inductor, and the second component comprises one or more of a resistor, a capacitor, and an inductor.

11. The data storage device of claim 9, wherein the height of the first set of contact pillars is at least ten times greater than the height of the first set of contact pads.

12. The data storage device of claim 9, further comprising:

a third set of contact pads and a second set of contact pillars, wherein the second set of contact pillars have a height greater than the third set of contact pads;

a third component coupled to the third set of contact pads along the first direction, wherein the third component has a first side facing the second set of contact pads, and a second side opposite the first side; and a fourth component coupled to the second set of contact pillars along the second direction, the fourth component having a first side facing the first set of contact pads, and a second side opposite the first side, wherein the fourth component is positioned above the first component and the third component such that at least a first portion of the second side of the first component and a first portion of the second side of the third component faces the first side of the fourth component.

13. The data storage device of claim 9, wherein the first direction is orthogonal to the second direction.

14. The data storage device of claim 9, wherein the first set of pillar contacts are copper pillar contacts.

15. The printed circuit board of claim 1, wherein the first set of contact pads and the first set of contact pillars are formed using a common process.

16. The printed circuit board of claim 15, wherein the common process is a deposition process.

* * * * *